United States Patent
Rapoport

(10) Patent No.: US 9,568,571 B2
(45) Date of Patent: Feb. 14, 2017

(54) MECHANICAL CLUTCH FOR MRI

(71) Applicant: Aspect Imaging Ltd., Shoham (IL)

(72) Inventor: Uri Rapoport, Moshav Ben Shemen (IL)

(73) Assignee: Aspect Imaging Ltd., Shoham (IL)

( * ) Notice: Subject to any disclaimer, the term of this patent is extended or adjusted under 35 U.S.C. 154(b) by 23 days.

(21) Appl. No.: 14/611,379

(22) Filed: Feb. 2, 2015

(65) Prior Publication Data
US 2015/0253397 A1    Sep. 10, 2015

Related U.S. Application Data

(60) Provisional application No. 61/950,233, filed on Mar. 10, 2014.

(30) Foreign Application Priority Data

Mar. 14, 2014 (DE) .................... 20 2014 101 187 U

(51) Int. Cl.
- *F16D 7/02* (2006.01)
- *G01R 33/36* (2006.01)
- *F16D 7/04* (2006.01)
- *G01R 33/34* (2006.01)
- *G01R 33/385* (2006.01)

(52) U.S. Cl.
CPC ............. *G01R 33/3642* (2013.01); *F16D 7/02* (2013.01); *F16D 7/048* (2013.01); *G01R 33/34092* (2013.01); *G01R 33/3628* (2013.01); *G01R 33/385* (2013.01); *Y10T 29/4984* (2015.01)

(58) Field of Classification Search
CPC ............. F16D 7/02; F16D 7/04; F16D 7/048; G01R 33/34092; G01R 33/3628; G01R 33/3642; G01R 33/385; Y10T 29/49826; Y10T 29/4984

USPC .......................... 464/30, 37, 41; 29/428, 434
See application file for complete search history.

(56) References Cited

U.S. PATENT DOCUMENTS

| | | | |
|---|---|---|---|
| 5,346,022 A * | 9/1994 | Krivec | F16D 7/048 |
| | | | 464/37 |
| 6,323,647 B1 | 11/2001 | Anderson et al. | |
| 7,378,848 B2 | 5/2008 | Gao et al. | |
| 7,621,815 B2 * | 11/2009 | Bosserdet, Jr. ......... | F16D 7/048 |
| | | | 464/37 |
| 7,777,491 B2 | 8/2010 | Gao et al. | |
| 8,851,018 B2 | 10/2014 | Rapoport et al. | |
| (Continued) | | | |

FOREIGN PATENT DOCUMENTS

| | | | |
|---|---|---|---|
| DE | 102011109375 A1 * | 2/2013 | ............. F16D 7/048 |
| DE | 202013104656 U1 * | 10/2013 | ............. F16D 7/048 |

OTHER PUBLICATIONS

Aspect Imaging Ltd., "Shutting Assembly for Closing an Entrance of an MRI Device", co-pending U.S. Appl. No. 14/540,163, filed Nov. 13, 2014.

(Continued)

*Primary Examiner* — Josh Skroupa
(74) *Attorney, Agent, or Firm* — Pearl Cohen Zedek Latzer Baratz LLP

(57) ABSTRACT

A mechanical clutch for preventing damage to a capacitor of an MRI device. The clutch prevents the application of excessive torque via the tuning rods of the gradient coil of the MRI device. The mechanical clutch allows the tuning rods to slip (disengage) when the capacitor reaches the end of its adjustment range.

17 Claims, 6 Drawing Sheets

(56) References Cited

U.S. PATENT DOCUMENTS

| | | |
|---|---|---|
| 8,896,310 B2 | 11/2014 | Rapoport |
| 2008/0204028 A1 | 8/2008 | DeVries et al. |
| 2011/0162652 A1 | 7/2011 | Rapoport |
| 2011/0186049 A1 | 8/2011 | Rapoport |
| 2011/0234347 A1 | 9/2011 | Rapoport |
| 2011/0304333 A1 | 12/2011 | Rapoport |
| 2012/0071745 A1 | 3/2012 | Rapoport |
| 2012/0073511 A1 | 3/2012 | Rapoport et al. |
| 2012/0077707 A1 | 3/2012 | Rapoport |
| 2012/0119742 A1 | 5/2012 | Rapoport |
| 2013/0079624 A1 | 3/2013 | Rapoport |
| 2013/0109956 A1 | 5/2013 | Rapoport |
| 2013/0237803 A1 | 9/2013 | Rapoport |
| 2013/0328559 A1 | 12/2013 | Rapoport |
| 2013/0328560 A1 | 12/2013 | Rapoport |
| 2013/0328563 A1 | 12/2013 | Rapoport |
| 2014/0050827 A1 | 2/2014 | Rapoport |
| 2014/0051973 A1 | 2/2014 | Rapoport et al. |
| 2014/0051974 A1 | 2/2014 | Rapoport et al. |
| 2014/0051976 A1 | 2/2014 | Rapoport et al. |
| 2014/0099010 A1 | 4/2014 | Rapoport |
| 2014/0103927 A1 | 4/2014 | Rapoport |
| 2014/0117989 A1 | 5/2014 | Rapoport |
| 2014/0128725 A1 | 5/2014 | Rapoport |
| 2014/0139216 A1 | 5/2014 | Rapoport |
| 2014/0142914 A1 | 5/2014 | Rapoport |
| 2014/0152302 A1 | 6/2014 | Rapoport et al. |
| 2014/0152310 A1 | 6/2014 | Rapoport |
| 2014/0158062 A1 | 6/2014 | Rapoport et al. |
| 2014/0230850 A1 | 8/2014 | Rapoport |
| 2014/0257081 A1 | 9/2014 | Rapoport |
| 2014/0266203 A1 | 9/2014 | Rapoport |
| 2014/0300358 A1 | 10/2014 | Rapoport |
| 2014/0378821 A1 | 12/2014 | Rapoport et al. |
| 2014/0378825 A1 | 12/2014 | Rapoport et al. |
| 2015/0065788 A1 | 3/2015 | Rapoport |

OTHER PUBLICATIONS

Aspect Imaging Ltd, "MRI—Incubator's Closure Assembly", co-pending U.S. Appl. No. 14/539,442, filed Nov. 12, 2014.

Aspect Imaging Ltd., "Cage in an MRD with a Fastening/Attenuating System", co-pending U.S. Appl. No. 14/527,950, filed Oct. 30, 2014.

Rapoport, Uri, "RF Shielding Conduit in an MRI Closure Assembly", co-pending U.S. Appl. No. 14/574,785, filed Dec. 18, 2014.

Aspect Imaging Ltd., "System and Method for Generating Invasively Hyperpolarized Images", co-pending U.S. Appl. No. 14/556,682, filed Dec. 1, 2014.

Aspect Imaging Ltd., "System and Method for Generating Invasively Hyperpolarized Images", co-pending U.S. Appl. No. 14/556,654, filed Dec. 1, 2014.

Aspect Imaging Ltd., "MRI with Magnet Assembly Adapted for Convenient Scanning of Laboratory Animals with Automated RF Tuning Unit", co-pending U.S. Appl. No. 14/581,266, filed Dec. 23, 2014.

Aspect Imaging Ltd., "Chamber for Housing Animals During Anaesthetic Procedures", co-pending U.S. Appl. No. 14/537,266, filed Nov. 10, 2014.

Aspect Imaging Ltd., "RF Automated Tuning System Used in a Magnetic Resonance Device and Methods Thereof", co-pending U.S. Appl. No. 14/588,741, filed Jan. 2, 2015.

Aspect Imaging Ltd., "Means for Operating an MRI Device Within a RF-Magnetic Environment", co-pending U.S. Appl. No. 14/596,320, filed Jan. 14, 2015.

Aspect Imaging Ltd., "Means and Method for Operating an MRI Device Within a RF-Magnetic Environment", co-pending U.S. Appl. No. 14/596,329, filed Jan. 14, 2015.

Aspect Imaging Ltd., "CT/MRI Integrated System for the Diagnosis of Acute Strokes and Methods Thereof", co-pending U.S. Appl. No. 14/598,517, filed Jan. 16, 2015.

Aspect Imaging Ltd., "Mechanical Clutch for MRI", co-pending U.S. Appl. No. 14/611,379, filed Feb. 2, 2015.

Aspect Imaging Ltd., "Method for Providing High Resolution, High Contrast Fused MRI Images", co-pending U.S. Appl. No. 13/877,533, filed May 22, 2014.

Aspect Imaging Ltd., "Method for Manipulating the MRI's Protocol of Pulse-Sequences", co-pending U.S. Appl. No. 14/070,695, filed Nov. 4, 2013.

Aspect Imaging Ltd., "Foamed Patient Transport Incubator", co-pending U.S. Appl. No. 14/531,289, filed Nov. 3, 2014.

Aspect Imaging Ltd., "Incubator Deployable Multi-Functional Panel", co-pending U.S. Appl. No. 14/619,557, filed Feb. 11, 2015.

Aspect Imaging Ltd., "MRI Thermo-Isolating Jacket", co-pending U.S. Appl. No. 14/623,039, filed Feb. 16, 2015.

Aspect Imaging Ltd., "MRI RF Shielding Jacket", co-pending U.S. Appl. No. 14/623,051, filed Feb. 16, 2015.

Aspect Imaging Ltd., "Capsule for a Pneumatic Sample Feedway", co-pending U.S. Appl. No. 14/626,391, filed Feb. 19, 2015.

Aspect Imaging Ltd., "Incubator's Canopy with Sensor Dependent Variably Transparent Walls and Methods for Dimming Lights Thereof", co-pending U.S. Appl. No. 14/453,909, filed Aug. 7, 2014.

Aspect Imaging Ltd., "Temperature-Contolled Exchangeable NMR Probe Cassette and Methods Thereof", co-pending U.S. Appl. No. 14/504,890, filed Oct. 2, 2014.

Aspect Imaging Ltd., "NMR Extractable Probe Cassette Means and Methods Thereof", co-pending U.S. Appl. No. 14/504,907, filed Oct. 2, 2014.

Aspect Imaging Ltd., "Temperature-Controlled Exchangeable NMR Probe Cassette and Methods Thereof", co-pending U.S. Appl. No. 14/504,890, filed Oct. 2, 2014.

* cited by examiner

MECHANICAL CLUTCH FOR MRI

CROSS-REFERENCE TO RELATED APPLICATIONS

This application claims priority from German Patent Application No. 202014101187.0, filed Mar. 14, 2014, and also claims priority from U.S. Patent Application No. 61/950,233, filed Mar. 10, 2014, all of which are hereby incorporated by reference.

FIELD OF THE INVENTION

The present invention generally relates to a clutch for preventing damage to a capacitor of an MRI device by applying excessive torque by the tuning rods of the gradient coil. More specifically, the clutch allows the tuning rods to slip (disengage) when the capacitor reaches the end of its adjustment range.

BACKGROUND OF THE INVENTION

The orientation of the image in MRI is controlled by varying the main magnetic field using gradient coils. In conducting MRI experiments, the coil must be tuned to the resonant frequency of the nuclei to be observed. Additionally, the impedance of the coil should be electrically matched to the impedance of the transmission line which is optimally coupled through the multiplexer to the receiver to obtain the maximum transfer of energy and to obtain the best signal to noise ratio (SNR). To tune and match the coil, conventional NMR coils have variable capacitors. Typically, at least one variable capacitor is adjusted to tune the coil to the desired resonant frequency and at least another variable capacitor is adjusted to match the impedance of the coil. To adjust the capacitance of the variable capacitors, mechanical linkages are coupled to variable capacitors in the coil known as the tuning rods.

The tuning rods extend from the proximal end of the transmit coil so as to allow a user to adjust the variable capacitors when the transmit coil is installed in the gradient coil. Mechanical clutches mounted on the tuning rods allow the tuning rods to slip when the variable capacitors reach the end of their adjustment range, thus reducing the likelihood of damage to the capacitors should the user attempt to turn a tuning rod past a capacitor's adjustment range.

A clutch is defined as a mechanical device that provides for the transmission of power (and therefore usually motion) from one component (the driving member) to another (the driven member) when engaged, but can be disengaged. A slip clutch is allows a rotating shaft to slip when higher than normal resistance is encountered on a machine.

Several MRI devices recite a clutch. For example, U.S. Pat. No. 6,323,647 recites motor driven tuning and matching of RF coils in an NMR probe comprising a switching clutch that includes a wave washer. Patent application US2008/0204028 also recites a mechanical clutch to allow the tuning rods to slip when the variable capacitors reach the end of their adjustment range, thus reducing the likelihood of damage to the capacitors.

However, no clutch was designed specifically for connecting the tuning rods to the capacitor whereas taking into consideration the special conditions of MRI safety.

There is thus a long unfelt need for a clutch that is MRI safe specifically designed to connected the tuning rods of the MRI coil to the capacitor.

SUMMARY

The present invention provides a mechanical clutch engaging the rotation of a first and a second rotatable shafts; said mechanical clutch comprises: an outer element (110) having a first main longitudinal axis (111) with distal and proximal ends, further having, in a plane perpendicular to said longitudinal axis on said distal end, a substantially cylindrical bore (112); said outer element is connected, in said proximal end, with said first shaft; said cylindrical bore comprises at least one semi-flexible member (113) (SFM) comprising at least one aperture (114); said SFM is configured to reversibly transition from a relaxed configuration (RC) (113A) to a tensed configuration (TC) (113B); said member; an inner element (120), having a second main longitudinal axis (121) with distal and proximal ends; said inner element is connected, in said proximal end, with said second shaft; said inner element comprises in said distal end a cylindrical protrusion (122) having a third main longitudinal axis (124); said cylindrical protrusion is configured to rotatably accommodate within said cylindrical bore; said protrusion comprises at least one bulge (123) perpendicular to said third longitudinal axis bulging from said cylindrical protrusion shell; said at least one bulge having a distal and a proximal end; said distal end is in contact with said cylindrical protrusion; wherein said SFM is in said RC when said proximal end of said bulge is reversibly accommodated within said aperture and in said TC when said proximal end of said bulge is located outside said aperture; wherein said SFM is configured to temporarily collapse outwardly when in said TC; wherein said clutch ceases to engage said rotation of said first and said second rotatable shafts when said SFM collapse outwardly.

It is another object of the current invention to disclose the mechanical clutch as defined in any of the above, wherein said inner element and said outer element are made of MRI safe materials.

It is another object of the current invention to disclose the mechanical clutch as defined in any of the above, wherein said inner element and said outer element are made of plastic.

It is another object of the current invention to disclose the mechanical clutch as defined in any of the above, wherein said plastic is thermoplastic.

It is another object of the current invention to disclose the mechanical clutch as defined in any of the above, wherein said mechanical clutch is selected from a group of clutches consisting of: ratcheting clutch, synchronous clutch, overload clutch, and any combination thereof.

It is another object of the current invention to disclose the mechanical clutch as defined in any of the above, wherein said member is in said relaxed configuration when the torque applied by said second shaft is below a predetermined value and in said tensed configuration when said torque equals or above said predetermined value.

It is another object of the current invention to disclose the mechanical clutch as defined in any of the above, wherein said predetermined value is adjustable.

It is another object of the current invention to disclose the mechanical clutch as defined in any of the above, wherein said mechanical clutch automatically reengages when said torque returns to less than said predetermined value.

It is another object of the current invention to disclose the mechanical clutch as defined in any of the above, wherein said mechanical clutch requires manual reengaging.

It is another object of the current invention to disclose the mechanical clutch as defined in any of the above, wherein said reengaging occurs by transitioning said bulge into said aperture.

It is another object of the current invention to disclose the mechanical clutch as defined in any of the above, wherein said clutch has backlash-free torque transmission.

It is another object of the current invention to disclose the mechanical clutch as defined in any of the above, wherein said first shaft is at least one capacitor and said second shaft is at least one tuning rod of a resonance coil of an MRI.

It is another object of the current invention to disclose a mechanical clutch (100) engaging the rotation of a first and a second rotatable shafts; said mechanical clutch comprises: an outer element (110) having a first main longitudinal axis (111) with distal and proximal ends, further having, in a plane perpendicular to said longitudinal axis on said distal end, a substantially cylindrical bore (112); said outer element is connected, in said proximal end, with said first shaft; said cylindrical bore comprises at least one semi-flexible member (SFM) (113) comprising at least one aperture (114); said SFM is configured to reversibly transition from a relaxed configuration (RC) (113A) to a tensed configuration (TC) (113B); said member; an inner element (120), having a second main longitudinal axis (121) with distal and proximal ends; said inner element is connected, in said proximal end, with said second shaft applying Torque (Tx); said inner element comprises in said distal end a cylindrical protrusion (122) having a third main longitudinal axis (124); said cylindrical protrusion is configured to rotatably accommodate within said cylindrical bore; said protrusion comprises at least one bulge (123) perpendicular to said third longitudinal axis bulging from said cylindrical protrusion shell; said at least one bulge having a distal and a proximal end; said distal end is in contact with said cylindrical protrusion; wherein said SFM is in said RC when said proximal end of said bulge is reversibly accommodated within said aperture and in said TC when said proximal end of said bulge is located outside said aperture; wherein said SFM is configured to temporarily collapse outwardly when in said TC; wherein said clutch ceases to engage said rotation of said first and said second rotatable shafts when said SFM collapse outwardly; wherein said proximal end of said bulge is accommodated within said aperture when said Tx equals or is lower than a predetermined torque value (PTV) and said proximal end of said bulge is located outside said aperture when said Tx is above said PTV.

It is another object of the current invention to disclose the mechanical clutch as defined in any of the above, wherein said mechanical clutch is made of MRI safe materials.

It is another object of the current invention to disclose the mechanical clutch as defined in any of the above, wherein said SFM is made of plastic.

It is another object of the current invention to disclose the mechanical clutch as defined in any of the above, wherein said plastic is thermoplastic.

It is another object of the current invention to disclose the mechanical clutch as defined in any of the above, wherein said first shaft is at least one capacitor and said second shaft is at least one tuning rod of a resonance coil of an MRI.

It is another object of the current invention to disclose the mechanical clutch as defined in any of the above, wherein said PTV is adjustable.

It is another object of the current invention to disclose the mechanical clutch as defined in any of the above, wherein said mechanical clutch is selected from a group of clutches consisting of: ratcheting clutch, synchronous clutch, overload clutch, and any combination thereof.

It is another object of the current invention to disclose the mechanical clutch as defined in any of the above, wherein said mechanical clutch automatically reengages when said Tx returns to less than said predetermined value.

It is another object of the current invention to disclose the mechanical clutch as defined in any of the above, wherein said mechanical clutch requires manual reengaging.

It is another object of the current invention to disclose the mechanical clutch as defined in any of the above, wherein said reengaging occurs by transitioning said bulge into said aperture.

It is another object of the current invention to disclose the mechanical clutch as defined in any of the above, wherein said first shaft is connected to said outer member through a Cardan joint configured to change the angle of said Tx applied by said second shaft.

It is another object of the current invention to disclose the mechanical clutch as defined in any of the above, wherein said clutch has backlash-free torque transmission.

It is another object of the current invention to disclose the mechanical clutch as defined in any of the above, wherein said Tx drops immediately when said mechanical clutch disengages.

It is another object of the current invention to disclose the mechanical clutch as defined in any of the above, wherein said first shaft is connected to said outer member through a Cardan joint configured to change the angle of said Tx applied by said TR.

It is another object of the current invention to disclose the mechanical clutch as defined in any of the above, wherein said first rotating shaft has a limit of torque it can receive (Ty).

It is another object of the current invention to disclose the mechanical clutch as defined in any of the above, wherein said Tx<Ty.

It is another object of the current invention to disclose a mechanical clutch (100) engaging the rotation of at least one capacitor (140) and a tuning rod of a resonance coil of an MRI (TR) (130); said mechanical clutch comprises: an outer element (110) having a first main longitudinal axis (111) with distal and proximal ends, further having, in a plane perpendicular to said longitudinal axis on said distal end, a substantially cylindrical bore (112), said outer element is connected, in said proximal end, with said at least one capacitor; said cylindrical bore comprises at least one semi-flexible member (SFM) (113) comprising at least one aperture (114); said SFM is configured to reversibly transition from a relaxed configuration (RC) (113A) to a tensed configuration (TC) (113B); said member; an inner element (120), having a second main longitudinal axis (121) with distal and proximal ends; said inner element is connected, in said proximal end, with said TR applying Torque (Tx); said inner element comprises in said distal end a cylindrical protrusion (122) having a third main longitudinal axis (124); said cylindrical protrusion is configured to rotatably accommodate within said cylindrical bore; said protrusion comprises at least one bulge (123) perpendicular to said third longitudinal axis bulging from said cylindrical protrusion shell; said at least one bulge having a distal and a proximal end; said distal end is in contact with said cylindrical protrusion; wherein said SFM is in said RC when said proximal end of said bulge is accommodated within said aperture and in said TC when said proximal end of said bulge is located outside said aperture; wherein said SFM is configured to temporarily collapse outwardly when in said TC; wherein said clutch ceases to disengage said at least one capacitor with said TR when said SFM collapse outwardly; wherein said proximal end of said bulge is reversibly accommodated within said aperture when said Tx equals or is lower than a predetermined torque value (PTV) and said proximal end of said bulge is located outside said aperture when said Tx is above said PTV.

It is another object of the current invention to disclose the mechanical clutch as defined in any of the above, wherein said mechanical clutch is made of MRI safe materials.

It is another object of the current invention to disclose the mechanical clutch as defined in any of the above, wherein said SFM is made of plastic.

It is another object of the current invention to disclose the mechanical clutch as defined in any of the above, wherein said plastic is thermoplastic.

It is another object of the current invention to disclose the mechanical clutch as defined in any of the above, wherein said PTV is adjustable.

It is another object of the current invention to disclose the mechanical clutch as defined in any of the above, wherein said mechanical clutch is selected from a group of clutches consisting of: ratcheting clutch, synchronous clutch, overload clutch, and any combination thereof.

It is another object of the current invention to disclose the mechanical clutch as defined in any of the above, wherein said mechanical clutch automatically reengages when said Tx returns to less than said predetermined value.

It is another object of the current invention to disclose the mechanical clutch as defined in any of the above, wherein said mechanical clutch requires manual reengaging.

It is another object of the current invention to disclose the mechanical clutch as defined in any of the above, wherein reengaging occurs by transitioning said bulge into said aperture.

It is another object of the current invention to disclose the mechanical clutch as defined in any of the above, wherein said capacitor is connected to said outer member through a Cardan joint configured to change the angle of said Tx applied by said TR.

It is another object of the current invention to disclose the mechanical clutch as defined in any of the above, wherein said clutch has backlash-free torque transmission.

It is another object of the current invention to disclose the mechanical clutch as defined in any of the above, wherein said Tx drops immediately when said mechanical clutch disengages.

It is another object of the current invention to disclose the mechanical clutch as defined in any of the above, wherein said at least one capacitor has a limit of torque it can receive (Ty).

It is another object of the current invention to disclose the mechanical clutch as defined in any of the above, wherein said Tx<Ty.

It is another object of the current invention to disclose a mechanical clutch (100) engaging a first and a second rotatable shafts; comprises: an outer housing (110) having a first main longitudinal axis with distal and proximal ends, further having, in a plain perpendicular to said second axis, a substantially cylindrical bore, said outer housing is connected, in said proximal end, with said second shaft; an inner element (120) configured to rotatably accommodate within said outer element, having a first main longitudinal axis with distal and proximal ends, connected, in said distal end, with said first shaft, characterized, in a plain perpendicular to said first axis, by a substantially cylindrical cross-section having a defined diameter, $D_I$; wherein said inner element comprises at least one bulge protruding said diameter $D_I$, said bulge is characterized by a proximal base located within diameter $D_I$ and distal end perturbing outside diameter $D_I$; wherein said outer housing further comprising at last one semi-flexible member configured to reversibly transition from a relaxed configuration, whereat said bulge in and a tensed configuration by a predefined torque ($T_X$); wherein said member comprises at least one aperture configured to reversibly accommodate said bulge's distal end; wherein the orientation of said bulge in respect to said member's opening is rotatably transformable from at least one first eclipsed orientation, where the bulge's distal portion is located within said opening, to at least one second non-eclipsed phase; wherein said member is configured to temporarily collapse outwardly when said bulge is in its eclipsed configuration; wherein at said eclipsed orientation, the rotation of both said first and said second shafts is synchronically engaged; and further wherein at said at least one second non-eclipsed phase, said first and said second shafts are disengaged.

It is another object of the current invention to disclose a method for manufacturing a mechanical clutch for engaging the rotation of a first and a second rotatable shafts (500); said method comprises steps of: (a) Obtaining (510): (i) an outer element having a first main longitudinal axis with distal and proximal ends, further having, in a plane perpendicular to said longitudinal axis on said distal end, a substantially cylindrical bore, said cylindrical bore comprises at least one semi-flexible member (SFM) comprising at least one aperture; said SFM is configured to reversibly transition from a relaxed configuration (RC) to a tensed configuration (TC); said member; (ii) an inner element, having a second main longitudinal axis with distal and proximal ends; said inner element is connected, in said distal end to a cylindrical protrusion having a third main longitudinal axis; said protrusion comprises at least one bulge perpendicular to said third longitudinal axis bulging from said cylindrical protrusion shell; said at least one bulge having a distal and a proximal end; said distal end is in contact with said cylindrical protrusion; (b) rotatably accommodating said protrusion within said cylindrical bore (520); (c) connecting said first shaft to said proximal end of said outer element (530); and, (d) connecting said second shaft to said proximal end of said inner element (540); said second shaft is applying torque (Tx); wherein said SFM is transitioning from said RC to said TC when said protrusion rotates and said proximal end of said bulge changes its location from within said aperture to outside said aperture; wherein said SFM temporarily collapses outwardly when transitioning to said TC; wherein said clutch ceases to engage said rotation of said first and said second rotatable shafts when said SFM collapse outwardly; wherein said proximal end of said bulge is accommodated within said aperture when said Tx equals or is lower than a predetermined torque value (PTV) and said proximal end of said bulge is located outside said aperture when said Tx is above said PTV.

It is another object of the current invention to disclose the method as defined in any of the above, additionally comprising a step of manufacturing said mechanical clutch from MRI safe materials.

It is another object of the current invention to disclose the method as defined in any of the above, additionally comprising a step of manufacturing said SFM from plastic.

It is another object of the current invention to disclose the method as defined in any of the above, additionally comprising a step of manufacturing said SFM from thermoplastic.

It is another object of the current invention to disclose the method as defined in any of the above, additionally comprising a step of manufacturing said mechanical clutch with a reengaging mechanism selected from a group consisting of: manual, automatic, and any combination thereof.

It is another object of the current invention to disclose the method as defined in any of the above, additionally comprising a step of selecting at least one capacitor for said first shaft and at least one tuning rod of resonance coil of an MRI for said second shaft.

It is another object of the current invention to disclose a method for manufacturing a mechanical clutch for engaging the rotation of at least one capacitor with a tuning rod of at least one resonance coil of an MRI (TR) (500); said method comprises steps of: (a) obtaining (510): (i) an outer element having a first main longitudinal axis with distal and proximal ends, further having, in a plane perpendicular to said longitudinal axis on said distal end, a substantially cylindrical bore, said cylindrical bore comprises at least one semi-flexible member (SFM) comprising at least one aperture; said SFM is configured to reversibly transition from a relaxed configuration (RC) to a tensed configuration (TC); said member; (ii) an inner element, having a second main longitudinal axis with distal and proximal ends; said inner element is connected, in said distal end to a cylindrical protrusion having a third main longitudinal axis; said protrusion comprises at least one bulge perpendicular to said third longitudinal axis bulging from said cylindrical protrusion shell; said at least one bulge having a distal and a proximal end; said distal end is in contact with said cylindrical protrusion; (b) rotatably accommodating said protrusion within said cylindrical bore (520); (c) connecting said at least one capacitor to said proximal end of said outer element (530); and, (d) connecting said TR to said proximal end of said outer element (540); wherein said SFM is transitioning from said RC to said TC when said protrusion rotates and said proximal end of said bulge changes its location from within said aperture to outside said aperture; wherein said SFM temporarily collapses outwardly when transitioning to said TC; wherein said clutch is ceasing to engage said rotation of said at least one capacitor and said TR when said SFM collapse outwardly; wherein said proximal end of said bulge is accommodating within said aperture when said Tx equals or is lower than a predetermined torque value (PTV) and said proximal end of said bulge is locating outside said aperture when said Tx is above said PTV.

It is another object of the current invention to disclose the method as defined in any of the above, additionally comprising a step of manufacturing said mechanical clutch from MRI safe materials.

It is another object of the current invention to disclose the method as defined in any of the above, additionally comprising a step of manufacturing said SFM from plastic.

It is another object of the current invention to disclose the method as defined in any of the above, additionally comprising a step of manufacturing said SFM from thermoplastic.

It is another object of the current invention to disclose the method as defined in any of the above, additionally comprising a step of manufacturing said mechanical clutch with a reengaging mechanism selected from a group consisting of: manual, automatic, and any combination thereof.

It is another object of the current invention to disclose the method as defined in any of the above, wherein said reengaging mechanism is reengaging only when said TX is below said PTV.

It is another object of the current invention to disclose the method as defined in any of the above, additionally comprising a step of determining said PTV.

It is another object of the current invention to disclose a method for operating a mechanical clutch for engaging the rotation of a first and a second rotatable shafts (600); said method comprises steps of: (a) obtaining (610): (i) an outer element having a first main longitudinal axis with distal and proximal ends, further having, in a plane perpendicular to said longitudinal axis on said distal end, a substantially cylindrical bore, said cylindrical bore comprises at least one semi-flexible member (SFM) comprising at least one aperture; said SFM is configured to reversibly transition from a relaxed configuration (RC) to a tensed configuration (TC); said member; (ii) an inner element, having a second main longitudinal axis with distal and proximal ends; said inner element is connected, in said distal end to a cylindrical protrusion having a third main longitudinal axis; said protrusion comprises at least one bulge perpendicular to said third longitudinal axis bulging from said cylindrical protrusion shell; said at least one bulge having a distal and a proximal end; said distal end is in contact with said cylindrical protrusion; (b) connecting said first shaft to said proximal end of said outer element (620); said first rotating shaft has a limit of torque it can receive (Ty); (c) connecting said second shaft to said proximal end of said inner element; said second shaft applying torque (Tx) (630); (d) accommodating said protrusion within said cylindrical bore (640); and, (e) rotating said protrusion within said cylindrical bore by torque (Tx) applied by said second shaft (650); wherein said SFM transitions from said RC to said TC when said protrusion rotates and said proximal end of said bulge changes its location from within said aperture to outside said aperture; wherein said SFM is temporarily collapses outwardly when transitioning to said TC; wherein said clutch ceases to engage said rotation of said first and said second rotatable shafts when said SFM collapse outwardly; wherein said proximal end of said bulge is accommodated within said aperture when said Tx equals or is lower than a predetermined torque value (PTV) and said proximal end of said bulge is located outside said aperture when said Tx is above said PTV.

It is another object of the current invention to disclose the method as defined in any of the above, additionally comprising a step of adjusting said PTV.

It is another object of the current invention to disclose the method as defined in any of the above, additionally comprising a step of reengaging said mechanical clutch in a manner selected from a group consisting of: automatic, manual, and any combination thereof.

It is another object of the current invention to disclose the method as defined in any of the above, wherein said reengaging is possible only when said Tx is less than said PTV.

It is another object of the current invention to disclose the method as defined in any of the above, additionally comprising a step of dropping immediately said Tx when said mechanical clutch is disengaging.

It is another object of the current invention to disclose the method as defined in any of the above, wherein said Tx<Ty.

It is another object of the current invention to disclose the method as defined in any of the above, additionally comprising step of disengaging by transitioning said bulge from said aperture.

It is another object of the current invention to disclose a method for operating a mechanical clutch for engaging the rotation of at least one capacitor with a at least one tuning rod of a resonance coil of an MRI (TR) (600); said method comprises steps of: (a) obtaining (610): (i) an outer element having a first main longitudinal axis with distal and proximal ends, further having, in a plane perpendicular to said longitudinal axis on said distal end, a substantially cylindrical bore, said cylindrical bore comprises at least one semi-flexible member (SFM) comprising at least one aperture; said SFM is configured to reversibly transition from a relaxed configuration (RC) to a tensed configuration (TC); said member; (ii) an inner element, having a second main longitudinal axis with distal and proximal ends; said inner element is connected, in said distal end to a cylindrical protrusion having a third main longitudinal axis; said protrusion comprises at least one bulge perpendicular to said third longitudinal axis bulging from said cylindrical protrusion shell; said at least one bulge having a distal and a proximal end; said distal end is in contact with said cylindrical protrusion; (b) connecting said at least one capacitor to said proximal end of said outer element (620); said at least one capacitor has a limit of torque it can receive (Ty); (c) connecting said at least one TR to said proximal end of said inner element (630); said second shaft is applying torque (Tx); (d) accommodating said protrusion within said cylindrical bore (640); and, (e) rotating said protrusion within said cylindrical bore (Tx) applied by said second shaft (650); wherein said SFM is transitioning from said RC to said TC when said protrusion rotates and said proximal end of said bulge changes its location from within said aperture to outside said aperture; wherein said SFM temporarily collapses outwardly when transitioning to said TC; wherein said clutch ceases to engage said rotation of said capacitor and said TR when said SFM collapse outwardly; wherein said proximal end of said bulge is accommodated within said aperture when said Tx equals or is lower than a predetermined torque value (PTV) and said proximal end of said bulge is located outside said aperture when said Tx is above said PTV.

It is another object of the current invention to disclose the method as defined in any of the above, additionally comprising a step of adjusting said PTV.

It is another object of the current invention to disclose the method as defined in any of the above, additionally comprising a step of reengaging said mechanical clutch in a manner selected from a group consisting of: automatic, manual, and any combination thereof.

It is another object of the current invention to disclose the method as defined in any of the above, wherein said reengaging is possible only when said Tx is less than said PTV.

It is another object of the current invention to disclose the method as defined in any of the above, additionally comprising a step of dropping immediately said Tx when said mechanical clutch is disengaging.

It is another object of the current invention to disclose the method as defined in any of the above, additionally comprising a step of automatically reengaging said mechanical clutch when said input torque returns to less than said predetermined value.

It is another object of the current invention to disclose the method as defined in any of the above, additionally comprising a step of manually reengaging said mechanical clutch.

It is another object of the current invention to disclose the method as defined in any of the above, additionally comprising a step of changing by a Carden joint the angle of said Tx before its transmission to said capacitor.

It is another object of the current invention to disclose the method as defined in any of the above, wherein said Tx<Ty.

It is another object of the current invention to disclose the method as defined in any of the above, additionally comprising step of disengaging by transitioning said bulge from said aperture.

BRIEF DESCRIPTION OF THE FIGURES

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention. The present invention may be practiced according to the claims without some or all of these specific details. For the purpose of clarity, technical material that is known in the technical fields related to the invention has not been described in detail so that the present invention is not unnecessarily obscured.

DETAILED DESCRIPTION OF THE EMBODIMENTS

Figures 1A, 1B:
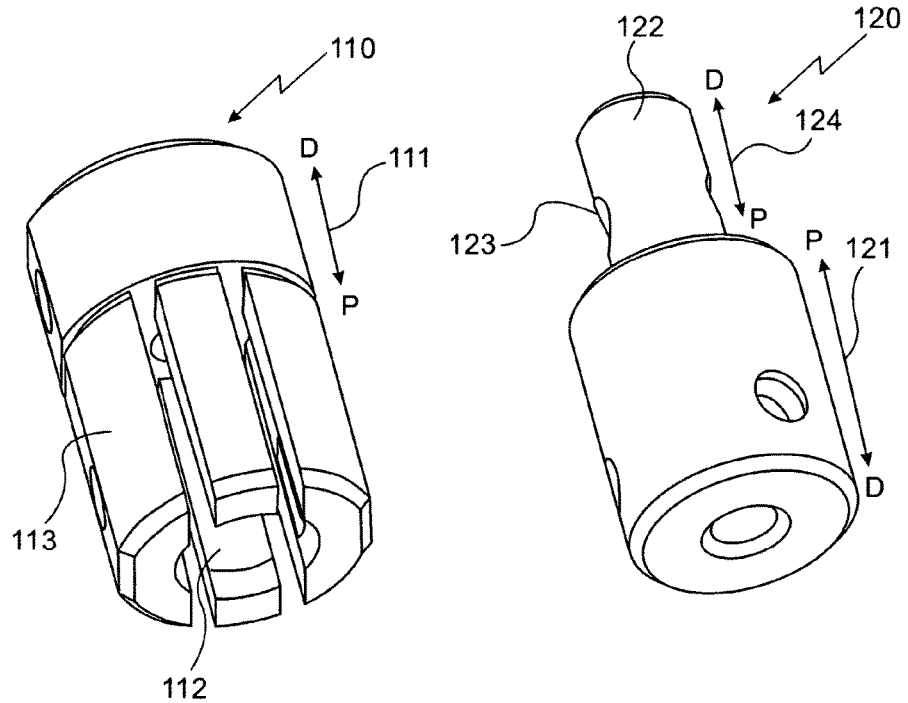
FIG. 1A is a schematic illustration of the outer element of a mechanical clutch.
FIG. 1B is a schematic illustration of the inner element of a mechanical clutch.

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention. The present invention may be practiced according to the claims without some or all of these specific details. For the purpose of clarity, technical material that is known in the technical fields related to the invention has not been described in detail so that the present invention is not unnecessarily obscured.

The essence of the present invention is to provide a mechanical clutch for transmitting torque from one element to the other. The receiving element has a limit to the torque it can receive so the clutch has a mechanism of disengaging when the torque approaches the limit of the receiving element to prevent damage to the receiving element.

In a specific embodiment the transmitting element is a tuning rod of the MRI coil and the receiving element is a capacitor. The capacitor has a limiting capacity and too much torque received from the tuning rod might damage it. The clutch mediates the torque from the tuning to output torque received by the capacitor. The clutch is configured to disengage when a specific amount of input torque is received. This specific amount is less than the amount that will cause damage to the capacitor to promise no damage to it.

In a preferred embodiment, a mechanical clutch engaging a first and a second rotatable shafts; The clutch comprises an outer housing having a first main longitudinal axis with distal and proximal ends, further having, in a plane perpendicular to said second axis, a substantially cylindrical bore, said outer housing is connected, in said proximal end, with said second shaft. The clutch further comprises an inner element configured to rotatably accommodate within said outer element, having a first main longitudinal axis with distal and proximal ends, connected, in said distal end, with said first shaft, characterized, in a plain perpendicular to said first axis, by a substantially cylindrical cross-section having a defined diameter, $D_I$ The inner element comprises at least one bulge protruding said diameter $D_I$ said bulge is characterized by a proximal base located within diameter $D_I$ and distal end perturbing outside diameter $D_I$ The outer housing further comprising at last one semi-flexible member configured to reversibly transition from a relaxed configuration, whereat said bulge in and a tensed configuration by a predefined torque ($T_X$). The member comprises at least one aperture configured to reversibly accommodate said bulge's distal end. The orientation of said bulge in respect to said member's opening is rotatably transformable from at least one first eclipsed orientation, where the bulge's distal portion is located within said opening, to at least one second non-eclipsed phase; the member is configured to temporarily collapse outwardly when said bulge is in its eclipsed configuration. The eclipsed orientation, the rotation of both said first and said second shafts is synchronically engaged; and further wherein at said at least one second non-eclipsed phase, said first and said second shafts are disengaged.

Reference is now made to FIGS. 1A, 1B, 1C, and 1D. The clutch (100) comprises an inner element (120) and an outer element (110). The outer element (120) is characterized by a first longitudinal axis (111) having a proximal and a distal end. It is adapted to accommodate the torque receiving element (TRE) (second rotating shaft) on the distal end and to accommodate the protrusion of the inner element in the proximal end (122). The part adapted to accommodate the protrusion is a substantially a cylindrical housing made comprising at least one semi-flexible member (113). The semi-flexible member comprises an aperture. In a preferred embodiment the semi-flexible panels are made of thermoplastic.

The inner element (120) is characterized by a second longitudinal axis (121) having a proximal and a distal end. The outer element is adapted to accommodate the torque generating element (first rotating shaft) on the distal end and to fit within the outer element through a cylindrical protrusion extending from the proximal end (122). The cylindrical protrusion is characterized by a third longitudinal axis (124) parallel to said second longitudinal axis. The protrusion comprises at least one bulge (123) bulging from the envelope of the cylindrical protrusion. The bulge is characterized by a proximal end connected to the protrusion and a proximal end. The distal end of the bulge is configure to accommodate within the aperture of the semi-flexible member under specific conditions. The input torque (Tx) applied by the first rotating shaft rotates the protrusion of the inner element.

Figure 1C:
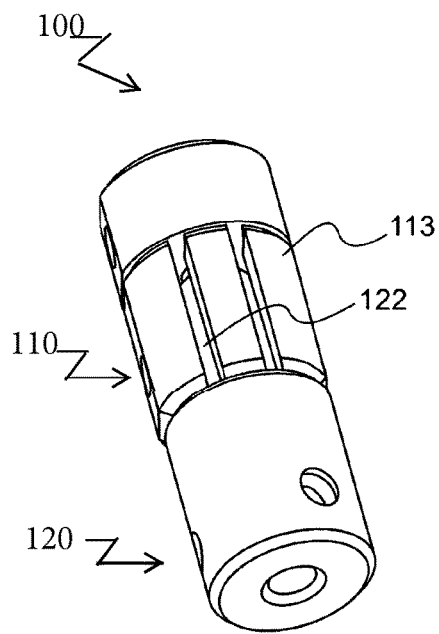
FIG. 1C is a schematic illustration of a mechanical clutch (100) in its closed form.

Reference is now made to FIG. 1C showing the inner and outer part of the mechanical clutch connected when the protrusion of the inner element is within the cylindrical housing of the outer element.

Figure 1D:
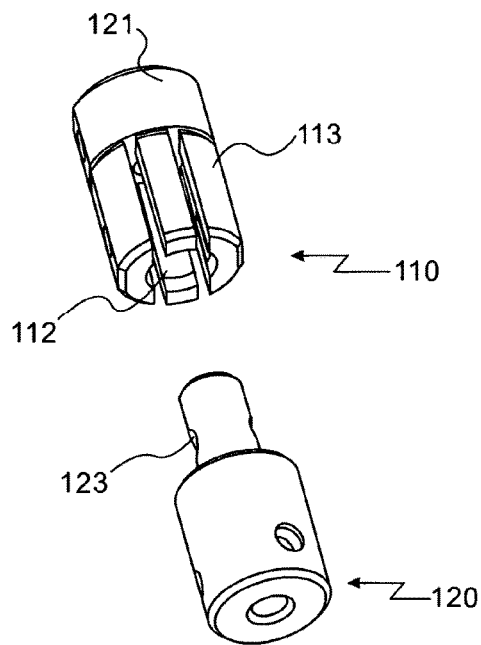
FIG. 1D is a schematic illustration of a mechanical clutch (100) in its opened form.

Reference is now made to FIG. 1D showing the inner and outer part of the mechanical separated.

Figures 2A, 2B:
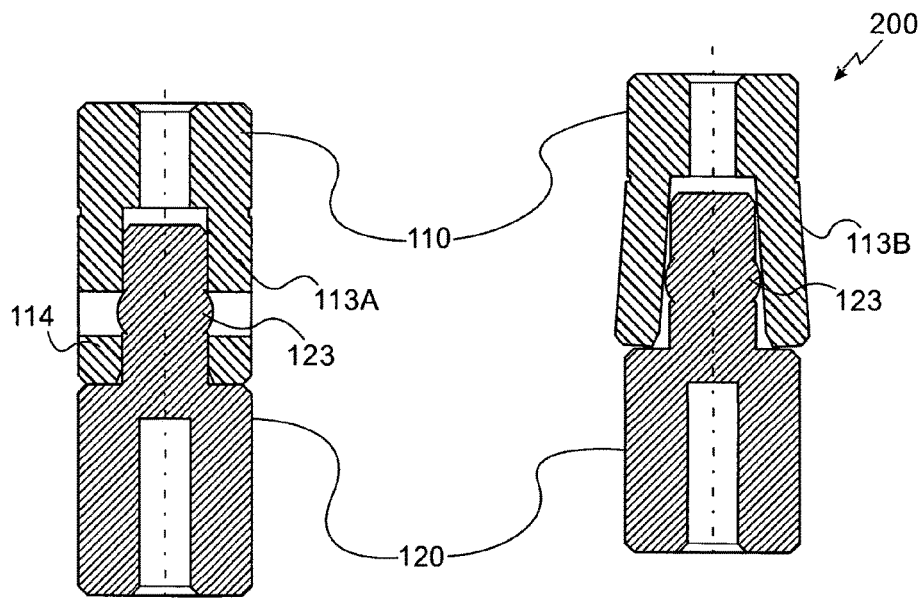
FIG. 2A is a schematic illustration of a mechanical clutch (200) in its relaxed configuration.
FIG. 2B is a schematic illustration of a mechanical clutch (200) in its tensed configuration.

Reference is now made to FIG. 2A and FIG. 2B which are schematic illustrations of a mechanical clutch in its relaxed and tensed configuration. As long as the input torque (Tx) generated by the first rotating shaft (tuning rod) is below a predetermined torque value (PTV) the bulge is accommodated inside the aperture of the semi-flexible member and it is in the relaxed configuration (113A). In the relaxed configuration the clutch is engaged and it transmits torque from the second rotating shaft to the first rotating shaft. Once the torque applied by the second rotating shaft exceeds the PTV the distal end of the bulge is accommodated outside the aperture of the semi-flexible member and it is said to be in a tensed configuration. In the tensed configuration the member collapse outwards (113B). Once the semi-flexible member collapses the clutch ceases to engage the torque from the second to the first shaft. In this state, the clutch is said to be disengaged, meaning that the input torque is not connected to the output torque received by the first rotating shaft.

In a preferred embodiment the PTV is lower than the maximal torque the first rotating shaft can bear. This eliminates the possibility of harming the first shaft by applying excess of torque which will cause it to mechanically break.

In a preferred embodiment once the torques returns to below PTV the clutch automatically reengages. In another preferred embodiment the clutch must be reengaged manually. Reengaging will be possible only when the torque is below the PTV.

In another preferred embodiment the first rotating shaft and/or the second rotating shaft are connected to the outer element and inner element, respectively, by a Carden Joint which enables change of the angle of the torque while transmitting it from the second shaft to the first shaft through the mechanical clutch.

Figure 2C:
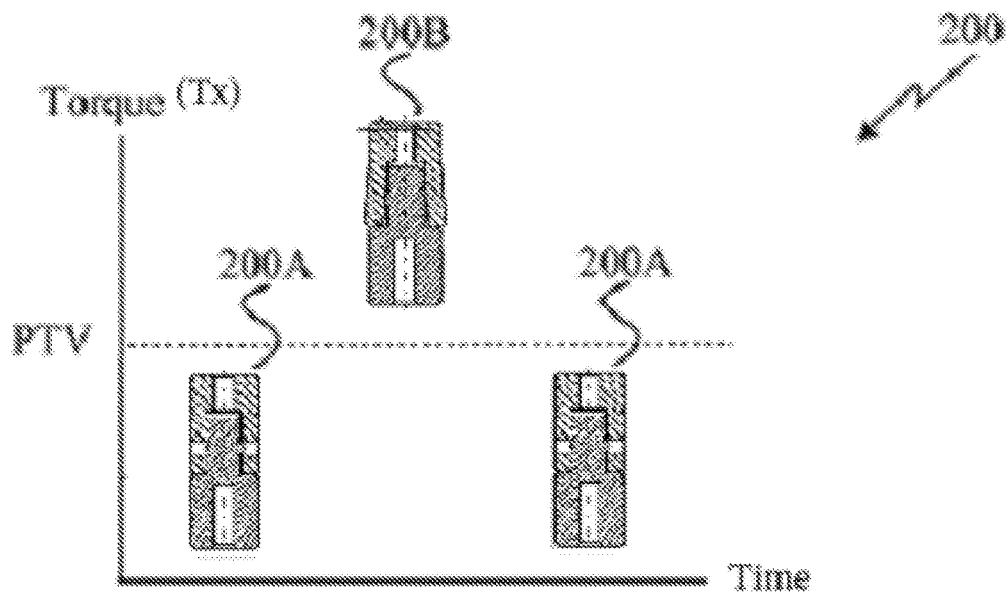
FIG. 2C is a schematic illustration of the mechanical clutch in its different forms according to the torque applied (Tx)

Reference is now made to FIG. 2C which is a schematic illustration of the mechanical clutch in its different forms according to the input torque applied (Tx) (200). The graph represents the amount of Tx applied on the inner part of the mechanical clutch. As long as the input torque is below the PTV then the clutch is in its relaxed configuration (200A). Once the clutch receives Tx that equals or above the PTV then the clutch transitions to its tensed configuration (200B). If the torque decreases back to below the PTV then the clutch reengages (either manually or automatically) and it returns to its relaxed configuration.

Figure 3A:
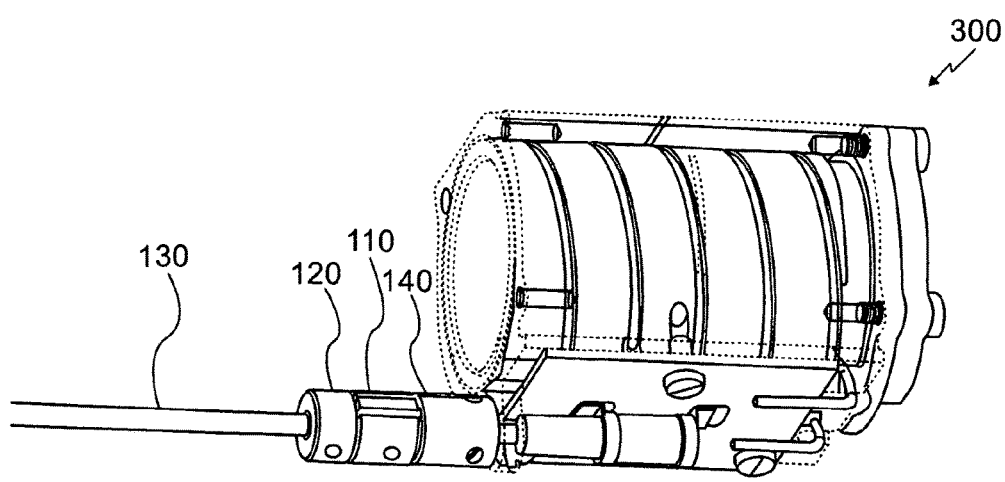
FIG. 3A and FIG. 3B are schematic illustrations of a mechanical clutch engaging a tuning rod of resonance coil to a capacitor (300)
Figure 3B:
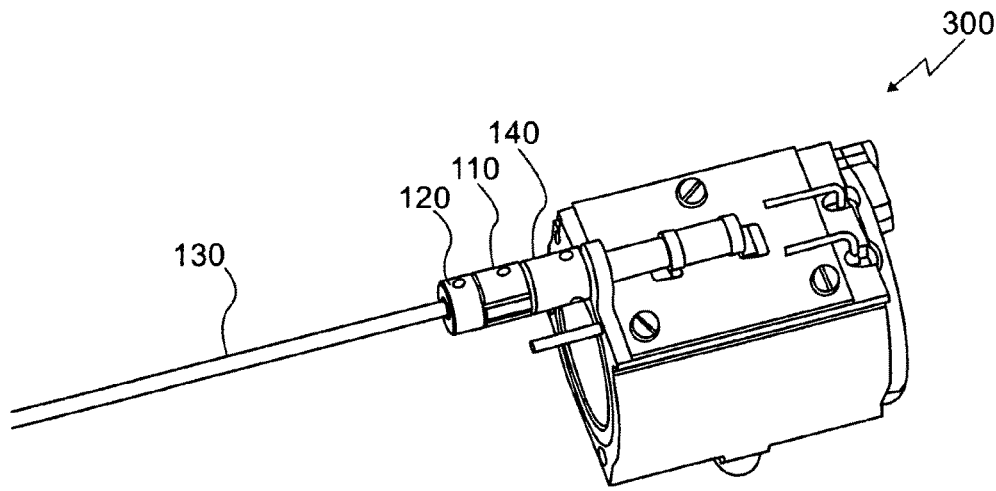

Reference is now made to FIG. 3A and FIG. 3B which are schematic illustrations of a mechanical clutch engaging a tuning rod of resonance coil to a capacitor. In this figure the tuning rod (130) of the MRI coils is accommodated within the outer element (110). The tuning rod provides the input torques and rotates the protrusion of the inner part. The capacitor (140) is accommodated within the outer element and receives torque output from the tuning rod through the clutch. In a preferred embodiment the clutch is connected to the capacitor through a Carden joint. The Carden joint interconnects the outer part of the clutch with the capacitor. The Carden joint enables change of the angle of the input torque to the output torque.

Figure 4:
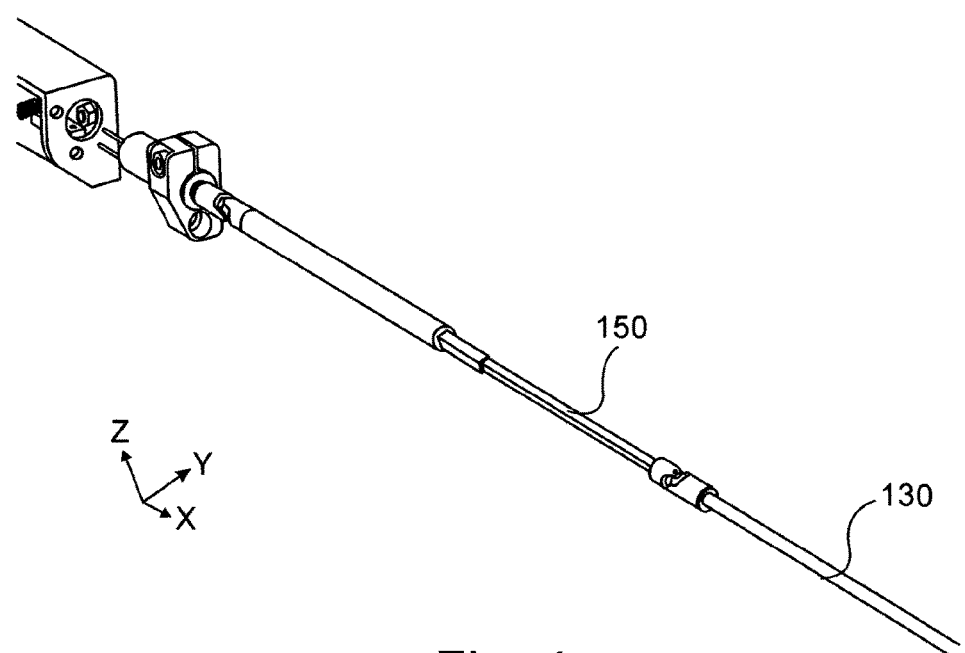
FIG. 4 is a schematic illustration of a tuning rod connected to a clutch through a Cardan joint.

Reference is now made to FIG. 4 which is a schematic illustration of a tuning rod connected to a clutch through a Cardan joint. The tuning rod applies a torque with a specific angle. If this angle needs to be changed before ithe torque is received by the capacitor than a Carden joint can interconnect the tuning rod with the clutch as shown in the figure. Another option (not shown) is to interconnect the capacitor to the clutch through a Carden joint.

The carden joint can be applied also more generally in when interconnecting any two rotatable shafts by a clutch. One of the shafts or both can be connected to the clutch through a Carden joint.

Figure 5:
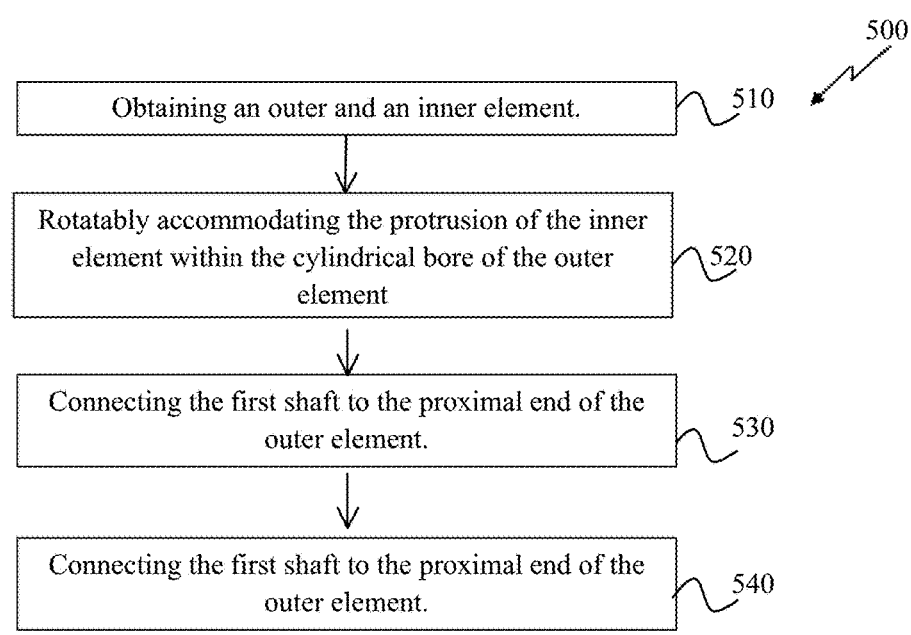
FIG. 5 is a flow chart showing a method for manufacturing a mechanical clutch (500); and, FIG. 6 is a flowchart showing a method for operating a mechanical clutch (600).

Reference is now made to FIG. 5 which is a flow chart showing a method for manufacturing a mechanical clutch (500). In the first step, an outer and an inner element as previously described are obtained (510). In the second step, the protrusion of the inner element is rotatably accommodated within the cylindrical bore of the outer element (520). The bulge of the protrusion will not be accommodated within the bulge as long as no torque is applied. In the third and fourth steps, the first shaft (the receiving torque shaft) is connected to the distal end of the outer element and the second shaft (torque generating shaft) is connected to the inner element (530, 540).

In a preferred embodiment the first shaft is a capacitor and the second shaft a tuning rod of a resonance coil on an MRI.

Figure 6:
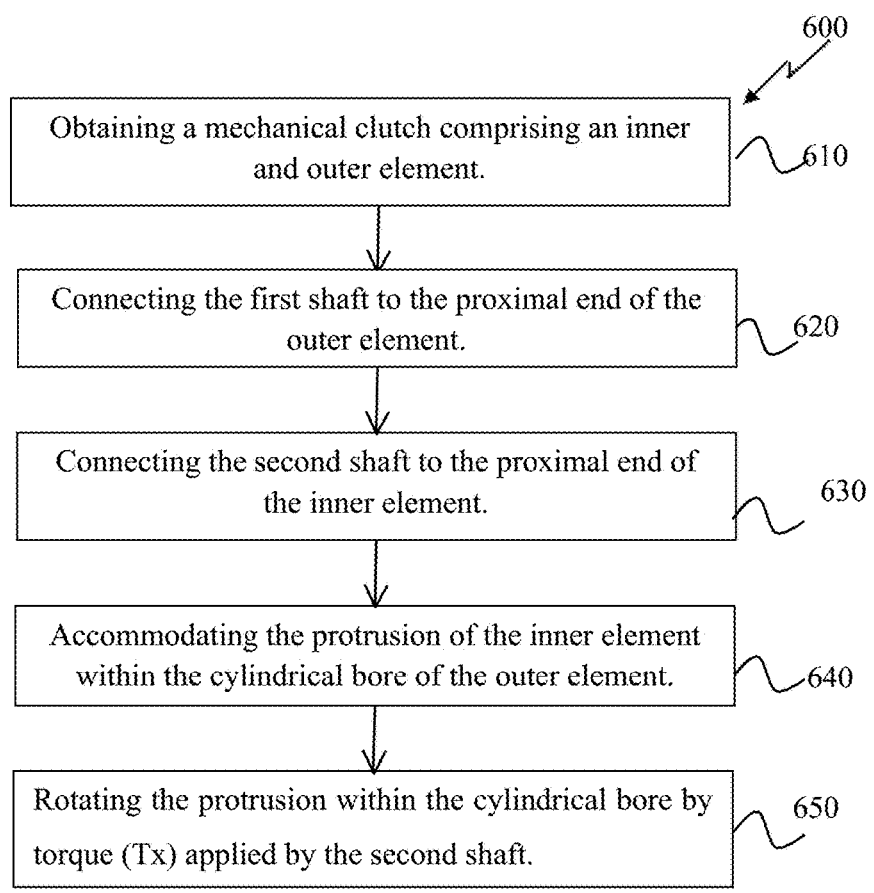

Reference is now made to FIG. 6 which is a flow chart showing a method for operating the mechanical clutch described above (600). In the first step (610) a mechanical clutch is obtained. The clutch comprises all the components mentioned in FIGS. 1-3 which include an outer element and an inner element. In the second and third steps, the first shaft (the receiving torque shaft) is connected to the distal end of the outer element and the second shaft (torque generating shaft) is connected to the inner element (620, 630). In the fourth step the cylindrical protrusion of the inner part is accommodated within the cylindrical bore of the outer part and then it is rotated (640). In the last step the protrusion is rotated within the bore (650). The protrusion has only partial freedom to rotate within the bore since it has at least one bulge. In a preferred embodiment the number of the bulges equal the number of semi-flexible members in the outer element. The CP can rotate freely as long as the bulge is not accommodated within the aperture of the semi-flexible member. This situation occurs as long as the input torque is below the PTV. Once the bulge is accommodated within the aperture the protrusion cannot rotate anymore and the torque is above the PTV and the semi-flexible member collapses outwards thus disengaging the input torque from the output torque.

Reference is still made to FIG. 6. The clutch can be reengaged either automatically when the torque is decrease to below PTV or it can be reengaged manually.

Reference is still made to FIG. 6. In a preferred embodiment, the PTV can be adjusted to fit different torque receiving elements according to their limits.

Reference is still made to FIG. 6. In a preferred embodiment the clutch is made from NMR safe materials. Most likely thermo plastic which is MRI safe (it does not contain metal) and it may change its shape and return to the original shape.

Reference is still made to FIG. 6. In a preferred embodiment as soon as the input torque exceeds the predetermined value the output torque drops to about zero immediately.

Reference is still made to FIG. 6. In a preferred embodiment the first shaft is a capacitor and the second shaft is tuning rod of a resonance coil of an MRI.

The term "capacitor" refers hereinafter to a passive two-terminal electrical component used to store energy electrostatically in an electric field. The capacitor comprises at least two electrical conductors (plates) separated by a dielectric (i.e., insulator). The conductors can be thin films of metal, aluminum foil or disks, etc. The 'nonconducting' dielectric acts to increase the capacitor's charge capacity.

The term "torque" refers hereinafter to the tendency of a force to rotate an object about an axis. Torque has dimensions of force times distance. Official SI literature suggests using the unit newton meter (N·m) or the unit joule per radian.

The term "slip clutch" refers hereinafter to a torque limiter or safety clutch or cushion clutch, this device allows a rotating shaft to slip when higher than normal resistance is encountered on a machine.

The term "impedance" refers hereinafter to the measure of the opposition that a circuit presents to a current when a voltage is applied.

The term "tuning rod" refers hereinafter to an element that extends from the proximal end of the transmit coil so as to allow a user to adjust the variable capacitors when the transmit coil is installed in the gradient coil.

The term "thermoplastic" refers hereinafter to polymer that becomes pliable or moldable above a specific temperature, and returns to a solid state upon cooling. Most thermoplastics have a high molecular weight. The polymer chains associate through intermolecular forces, which permits thermoplastics to be remolded because the intermolecular interactions increase upon cooling and restore the bulk properties. In this way, thermoplastics differ from thermosetting polymers, which form irreversible chemical bonds during the curing process. Thermosets often do not melt, but break down and do not reform upon cooling.

The term "Cardan joint" refers hereinafter to a universal joint, universal coupling, U-joint, Hardy-Spicer joint, or Hooke's joint. The Cardan joint is a joint or coupling in a rigid rod that allows the rod to 'bend' in any direction, and is commonly used in shafts that transmit rotary motion. It consists of a pair of hinges located close together, oriented at 90° to each other, connected by a cross shaft.

What is claimed is:

1. A mechanical clutch comprising:
    an outer element having a first main longitudinal axis with distal and proximal ends, further having, in a plane perpendicular to said longitudinal axis on said distal end, a substantially cylindrical bore; said outer element is configured to be connected, in said proximal end, with a first rotatable shaft; said cylindrical bore comprises at least one semi-flexible member "SFM" comprising at least one aperture; said SFM is configured to automatically reversibly transition from a relaxed configuration "RC" to a tensed configuration "TC";
    an inner element, having a second main longitudinal axis with distal and proximal ends; said inner element is configured to be connected, in said proximal end, with a second rotatable shaft; said inner element comprises, in said distal end, a cylindrical protrusion having a third main longitudinal axis; said cylindrical protrusion is configured to rotatably accommodate within said cylindrical bore; said protrusion comprises at least one bulge perpendicular to said third longitudinal axis bulging from said cylindrical protrusion shell; said at least one bulge having a distal and a proximal end; said distal end is in contact with said cylindrical protrusion;
    wherein said SFM is in said RC when said proximal end of said bulge is reversibly accommodated within said aperture and in said TC when said proximal end of said bulge is located outside said aperture;

wherein said SFM is configured to temporarily collapse outwardly when in said TC;

wherein said clutch ceases to engage said rotation of said first and said second rotatable shafts when said SFM collapses outwardly.

2. The mechanical clutch of claim 1, wherein said inner element and said outer element are either (a) MRI safe materials; (b) plastic; (c) thermoplastic; or (d) any combination thereof.

3. The mechanical clutch of claim 1, wherein said mechanical clutch is selected from a group of clutches consisting of: ratcheting clutch, synchronous clutch, overload clutch, and any combination thereof.

4. The mechanical clutch of claim 1, wherein said semi-flexible member is in said relaxed configuration when the torque applied by said second shaft is below a predetermined value and in said tensed configuration when said torque equals or above said predetermined value.

5. The mechanical clutch of claim 4, wherein at least one of the following is being held true (a) said predetermined value is adjustable; (b) said mechanical clutch automatically reengages when said torque returns to less than said predetermined value.

6. The mechanical clutch of claim 1, wherein at least one of the following is being held true (a) said mechanical clutch requires manual reengaging; (b) said reengaging occurs by transitioning said bulge from said aperture; (c) said clutch has backlash-free torque transmission; (d) said first shaft is at least one capacitor and said second shaft is at least one tuning rod of a resonance coil of an MRI; (e) and combination thereof.

7. The mechanical clutch of claim 1,
wherein said second shaft applies a torque "Tx", and said proximal end of said bulge is accommodated within said aperture when said Tx equals or is lower than a predetermined torque value "PTV" and said proximal end of said bulge is located outside said aperture when said Tx is above said PTV.

8. The mechanical clutch of claim 7, wherein at least one of the following is being held true (a) said first shaft is at least one capacitor and said second shaft is at least one tuning rod of a resonance coil of an MRI; (b) said PTV is adjustable; (c) said mechanical clutch is selected from a group of clutches consisting of: ratcheting clutch, synchronous clutch, overload clutch, and any combination thereof; (d) said mechanical clutch automatically reengages when said Tx returns to less than said predetermined value; (e) said mechanical clutch requires manual reengaging; (f) said reengaging occurs by transitioning said bulge from said aperture; (g) any combination thereof.

9. The mechanical clutch of claim 7, wherein at least one of the following is being held true (a) said first shaft is connected to said outer member through a Cardan joint configured to change the angle of said Tx applied by said second shaft; (b) said clutch has backlash-free torque transmission; (c) said Tx drops immediately when said mechanical clutch disengages; (d) said first shaft is connected to said outer member through a Cardan joint configured to change the angle of said Tx applied by said TR; and any combination thereof.

10. The mechanical clutch of claim 7, wherein said first rotating shaft has a limit of torque it can receive "Ty".

11. The mechanical clutch of claim 10, wherein said Tx<Ty.

12. A mechanical clutch comprising:
an outer element having a first main longitudinal axis with distal and proximal ends, further having, in a plane perpendicular to said longitudinal axis on said distal end, a substantially cylindrical bore, said outer element is configured to be connected, in said proximal end, with at least one capacitor; said cylindrical bore comprises at least one semi-flexible member "SFM" comprising at least one aperture; said SFM is configured to reversibly transition from a relaxed configuration "RC" to a tensed configuration "TC";

an inner element, having a second main longitudinal axis with distal and proximal ends; said inner element is configured to be connected, in said proximal end, with a tuning rod of a resonance coil of an MRI "TR" applying torque "Tx"; said inner element comprises, in said distal end, a cylindrical protrusion having a third main longitudinal axis; said cylindrical protrusion is configured to rotatably accommodate within said cylindrical bore; said protrusion comprises at least one bulge perpendicular to said third longitudinal axis bulging from said cylindrical protrusion shell; said at least one bulge having a distal and a proximal end; said distal end is in contact with said cylindrical protrusion; wherein said SFM is in said RC when said proximal end of said bulge is accommodated within said aperture and in said TC when said proximal end of said bulge is located outside said aperture;

wherein said SFM is configured to temporarily collapse outwardly when in said TC;

wherein said clutch ceases to disengage said at least one capacitor with said TR when said SFM collapses outwardly;

wherein said proximal end of said bulge is reversibly accommodated within said aperture when said Tx is above a predetermined torque value "PTV" and said proximal end of said bulge is located outside said aperture when said Tx equals or is lower than said PTV wherein said mechanical clutch automatically reengages when said Tx returns to less than said predetermined value.

13. The mechanical clutch of claim 12, wherein said mechanical clutch is made of either (a) MRI safe materials; (b) plastic; (c) thermoplastic; or (d) any combination thereof.

14. The mechanical clutch of claim 12, wherein at least one of the following is being held true (a) said PTV is adjustable; (b) said mechanical clutch is selected from a group of clutches consisting of: ratcheting clutch, synchronous clutch, overload clutch, and any combination thereof (c) reengaging occurs by transitioning said bulge from said aperture; (d) said capacitor is connected to said outer member through a Cardan joint configured to change the angle of said Tx applied by said TR; and any combination thereof.

15. The mechanical clutch of claim 12, wherein at least one of the following is being held true (a) said clutch has backlash-free torque transmission; (b) said Tx drops immediately when said mechanical clutch disengages; and any combination thereof.

16. The mechanical clutch of claim 12, wherein said at least one capacitor has a limit of torque it can receive "Ty".

17. The mechanical clutch of claim 16, wherein said Tx<Ty.

* * * * *